（12）United States Patent
Suganuma et al.

(10) Patent No.: US 9,099,665 B2
(45) Date of Patent: Aug. 4, 2015

(54) ORGANIC ELECTRO-LUMINESCENCE DISPLAY DEVICE

(75) Inventors: Naotoshi Suganuma, Yokohama (JP); Ichinori Takada, Yokohama (JP)

(73) Assignee: Samsung Display Co., Ltd., Gyeonggi-do (KR)

( * ) Notice: Subject to any disclaimer, the term of this patent is extended or adjusted under 35 U.S.C. 154(b) by 125 days.

(21) Appl. No.: 13/610,498

(22) Filed: Sep. 11, 2012

(65) Prior Publication Data
US 2013/0153940 A1 Jun. 20, 2013

(30) Foreign Application Priority Data

Dec. 16, 2011 (JP) .................................. 2011-276245
Apr. 26, 2012 (KR) ........................ 10-2012-0043969

(51) Int. Cl.
H01L 29/20 (2006.01)
H01L 51/00 (2006.01)
H01L 51/50 (2006.01)
H01L 51/52 (2006.01)
H01L 27/32 (2006.01)

(52) U.S. Cl.
CPC .............. *H01L 51/50* (2013.01); *H01L 27/3232* (2013.01); *H01L 51/5281* (2013.01)

(58) Field of Classification Search
CPC .. H01L 51/50; H01L 51/5281; H01L 27/3232
USPC ........................................ 257/40, 88, 89, 642
See application file for complete search history.

(56) References Cited

U.S. PATENT DOCUMENTS

| 7,375,464 | B2* | 5/2008 | Chin et al. | 313/506 |
| 7,463,399 | B2* | 12/2008 | Shin et al. | 359/265 |
| 7,760,165 | B2* | 7/2010 | Cok | 345/76 |
| 7,875,895 | B2* | 1/2011 | Kwack et al. | 257/98 |
| 7,948,167 | B2* | 5/2011 | Chung et al. | 313/504 |
| 8,120,245 | B2* | 2/2012 | Reynolds et al. | 313/504 |
| 8,421,084 | B2* | 4/2013 | Kang et al. | 257/72 |
| 8,525,157 | B2* | 9/2013 | Jeong et al. | 257/40 |
| 8,659,218 | B2* | 2/2014 | Hwang et al. | 313/504 |
| 8,854,401 | B2* | 10/2014 | Chen et al. | 345/694 |
| 2007/0133682 | A1* | 6/2007 | Arai et al. | 375/240.16 |
| 2008/0296600 | A1* | 12/2008 | Kwack et al. | 257/98 |
| 2009/0135212 | A1* | 5/2009 | Lee | 345/690 |
| 2011/0031877 | A1* | 2/2011 | Takada et al. | 313/504 |

FOREIGN PATENT DOCUMENTS

| JP | 2836497 B2 | 10/1998 |
| KR | 10-0732849 B1 | 6/2007 |
| KR | 10-2009-0100920 A | 9/2009 |
| KR | 10-2010-0001642 A | 1/2010 |
| KR | 10-2010-0004031 A | 1/2010 |

\* cited by examiner

*Primary Examiner* — Nicholas Tobergte
(74) *Attorney, Agent, or Firm* — Knobbe, Martens, Olson & Bear, LLP

(57) ABSTRACT

An organic light emitting diode (OLED) display is disclosed. The display has high contrast and displays good black color by removing or decreasing influence of ambient light. The display includes an organic electro-luminescence emission layer and a plurality of pixels respectively including an active lighting layer disposed on the organic electro-luminescence emission layer. In the pixels, when the organic electro-luminescence emission layer emits light, light transmittance of the active lighting layer is decreased.

11 Claims, 8 Drawing Sheets

PIX

PIX

ORGANIC ELECTRO-LUMINESCENCE DISPLAY DEVICE

CROSS-REFERENCE TO RELATED APPLICATIONS

This application claims priority to and the benefit of Japanese Patent Application No. 2011-276245 filed in the Japanese Patent Office on Dec. 16, 2011, and Korean Patent Application No. 10-2012-0043969 filed in the Korean Intellectual Property Office on Apr. 26, 2012, the entire contents of each of which are incorporated herein by reference.

BACKGROUND

1. Field

The described technology relates generally to an organic electro-luminescence (EL) display device.

2. Description of the Related Technology

Recently, research on organic light emitting diode (OLED) displays using an organic light emitting material as a light emitting element of a display unit has been actively conducted. The organic light emitting diode (OLED) display, unlike a liquid crystal display (LCD), is self-emissive because light is generated by a light-emitting organic electro-luminescence material to display images.

In a conventional transmissive organic light emitting diode (OLED) display, a black display is realized by not emitting light from the organic electro-luminescence element. However, despite the lack of light emission, ambient light from the rear surface is transmitted. Because of the ambient background light it is difficult to display black. As a result, contrast is decreased, and a desired image to be displayed may not be appropriately reproduced.

By a combination of a photochromic layer in the rear surface of the organic light emitting diode (OLED) display, a technique for improving light emission as experience by viewers has been disclosed in Patent Document 1 (Japanese Patent Laid-Open Publication No. 8-78165). Patent Document 1 discloses a technique for improving the light emission from an organic electro-luminescence light emitting element with a colored rear surface when the organic electro-luminescence element is exposed to bright ambient. A photochromic material layer is used on the rear surface of the organic electro-luminescence element. This technique uses a meter installed on an auto dashboard.

However, in the technique disclosed in Patent Document 1, a light blocking state may only be formed on the entire rear surface of the display device. Also, the bright ambient light is required for generating the light blocking state, and the speed of a color change of the photochromic material is too slow for practical applications. Accordingly, because of the color change of the photochromic material and the reaction speed, the above technique may not be used to solve the problem of the black expression in the display device.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect is an organic light emitting diode (OLED) display including an organic electro-luminescence emission layer, and a plurality of pixels respectively including an active lighting layer disposed on the organic electro-luminescence emission layer.

DETAILED DESCRIPTION OF CERTAIN INVENTIVE EMBODIMENTS

An organic light emitting diode (OLED) display according to an exemplary embodiment will be described with reference to accompanying drawings. Also, exemplary embodiments below are only certain exemplary embodiments, and the present invention is not limited thereto.

First Exemplary Embodiment

An organic light emitting diode (OLED) display according to a first exemplary embodiment will be described with reference to the accompanying drawings.

Figure 1A:
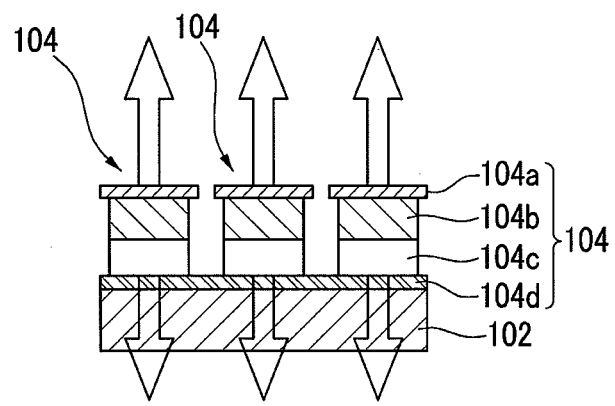
FIG. 1A and FIG. 1B are views showing an organic light emitting element 104 in an organic light emitting diode (OLED) display 100 according to the first exemplary embodiment.
Figure 1B:
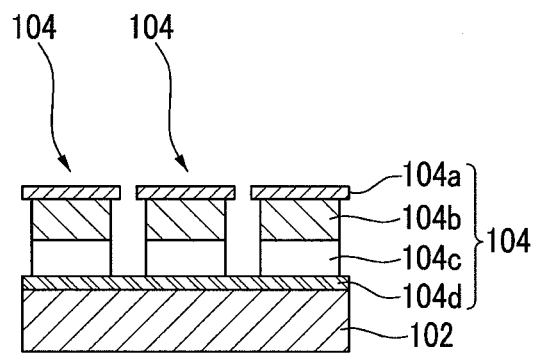

Referring to FIG. 1A and FIG. 1B, an operation principle of an organic light emitting diode (OLED) display according to the first exemplary embodiment will be described. FIG. 1A and FIG. 1B are views showing a constitution of an organic light emitting element 104 in an organic light emitting diode (OLED) display 100 according to the first exemplary embodiment. Also, for better understanding and ease of description, FIG. 1A and FIG. 1B partially show a constitution of an organic light emitting diode (OLED) display 100 according to the first exemplary embodiment.

As shown in FIG. 1A and FIG. 1B, an organic light emitting diode (OLED) display 100 according to the present embodiment includes a plurality of organic light emitting elements 104 and a substrate 102. The organic light emitting elements 104 respectively include an electrode 104a, an organic electro-luminescence emission layer 104b, an active lighting layer 104c, and an electrode 104d. In the present embodiment, the electrode 104d is commonly formed for a plurality of organic light emitting elements 104. Also, an element including the electrode 104a, the organic electro-luminescence emission layer 104b, and the electrode 104d is referred to as an organic electro-luminescence light emitting element, and an element including the electrode 104a, the active lighting layer 104c, and the electrode 104d is referred to as an active lighting element.

Voltages are applied to the electrode 104a and the electrode 104d of the organic light emitting element 104 such that light is generated by excitons generated by a recombination of electrons and holes injected in the organic electro-luminescence emission layer 104b. The active lighting layer 104c is a layer having a function of reversibly changing light transmittance by the electric field from the outside. As the active lighting layer 104c, there are an electrochromic layer including an electrochromic material, an electro-wetting layer using an electro-wetting material, a lighting mirror layer, or a liquid crystal layer using a liquid crystal material. As the electrochromic material, any of the following may be used: polyaniline, a polyethylene terephthalate derivative, a Prussian blue derivative, a hexaarylethane derivative, tungsten oxide, 4,4'-biphenyl dicarboxylic acid diethyl ester, a 1,4-bis(2,2':6', 2"-terpyridine-4-yl)benzene metallic ion complex, and complexes thereof. Also, in the present embodiment, the active lighting layer 104c applies a normally black mode, that is, a mode in which the light transmittance is decreased when the voltage is not applied to the active lighting layer 104c. Meanwhile, the active lighting layer 104c may apply a normally white mode, that is, a mode in which the light transmittance is decreased when the voltage is applied to the active lighting layer 104c.

Also, in the present embodiment, by applying the electric field from the outside to flow a current, the active lighting layer 104c changes the light transmittance. Accordingly, as an example of the active lighting layer 104c of the present embodiment, the electrochromic layer using the electrochromic material and the lighting mirror layer may be used.

FIG. 1A shows the operation state of a case of displaying a color other than black, that is, performing a predetermined color expression by light-emitting the organic electro-luminescence emission layer 104b. By applying the voltage to the electrode 104a and the electrode 104d of the organic light emitting element 104, the light emission of the predetermined color is generated by the excitons generated by the recombination of the electrons and the holes injected among the organic electro-luminescence emission layer. In the present embodiment, the voltage is applied to the active lighting layer 104c such that the light transmittance of the active lighting layer 104c is increased. In this state, surrounding light incident to the organic light emitting element 104 is transmitted to the electrode 104a, the organic electro-luminescence emission layer 104b, the active lighting layer 104c, and the electrode 104d, and is emitted through an opposite surface.

FIG. 1B shows a case of performing black display, that is, the organic electro-luminescence emission layer (b) does not emit light. When performing the black display, by decreasing the light transmittance of the active lighting layer 104c, the surrounding light incident to the organic light emitting element 104 is blocked or reduced by the active lighting layer 104c. In the present embodiment, the active lighting layer 104c is operated in the normally black mode, that is, when the voltage is not applied to the active lighting layer 104c, the light transmittance is decreased. Accordingly, the surrounding light incident to the organic light emitting element 104 is not transmitted to the opposite surface, or is absorbed, reflected, or otherwise reduced such that the influence from the surrounding light is eliminated or decreased, thereby performing the black display. As described above, by the decreasing of the light transmittance of the active lighting layer 104c, the light transmittance of a region where the black is displayed may be locally decreased, thereby displaying a good local black.

Figure 2:
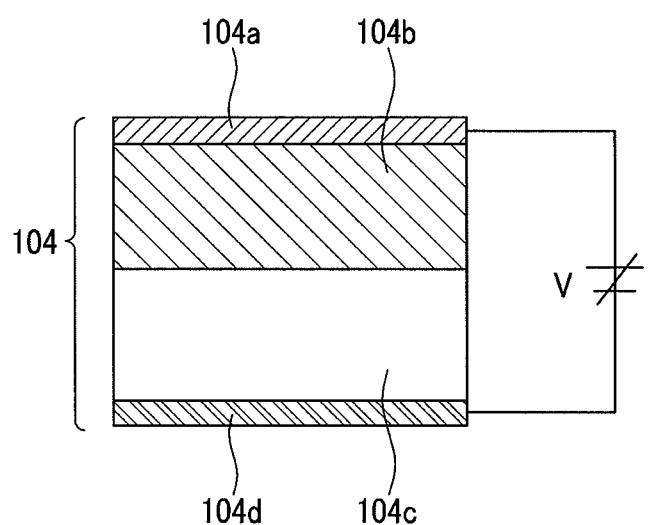
FIG. 2 is a view of an organic light emitting element 104 in an organic light emitting diode (OLED) display 100 according to the first exemplary embodiment.

FIG. 2 is a view of an organic light emitting element 104 in an organic light emitting diode (OLED) display 100 according to the first exemplary embodiment. In the present embodiment, the organic light emitting element 104 and the active lighting layer 104c are integrally controlled. The voltage applied to the electrode 104a and the electrode 104d is referred to as V, a light emitting start voltage of the organic electro-luminescence emission layer 104b is referred to as $X_1$, and a threshold voltage through which a change of light transmittance of the active lighting layer 104c is generated is referred to as $X_2$. In the present embodiment, the operation of the organic light emitting element 104 may be controlled as follows.

If $V<X_2$, the organic electro-luminescence emission layer 104b does not emit the light, and the active lighting layer 104c blocks or reduces transmitted light, and black is displayed.

If $X_1>V>X_2$, the organic electro-luminescence emission layer 104b does not emit the light, and the light transmittance of the active lighting layer 104c increases.

If $V>X_1$, the organic electro-luminescence emission layer 104b emits light, and the light transmittance of the active lighting layer 104c is sufficient to transmit the emitted light.

As described above, the organic electro-luminescence emission layer 104b and the active lighting layer 104c may be controlled by the voltage applied to the electrodes 104a and 104d.

Figure 3:
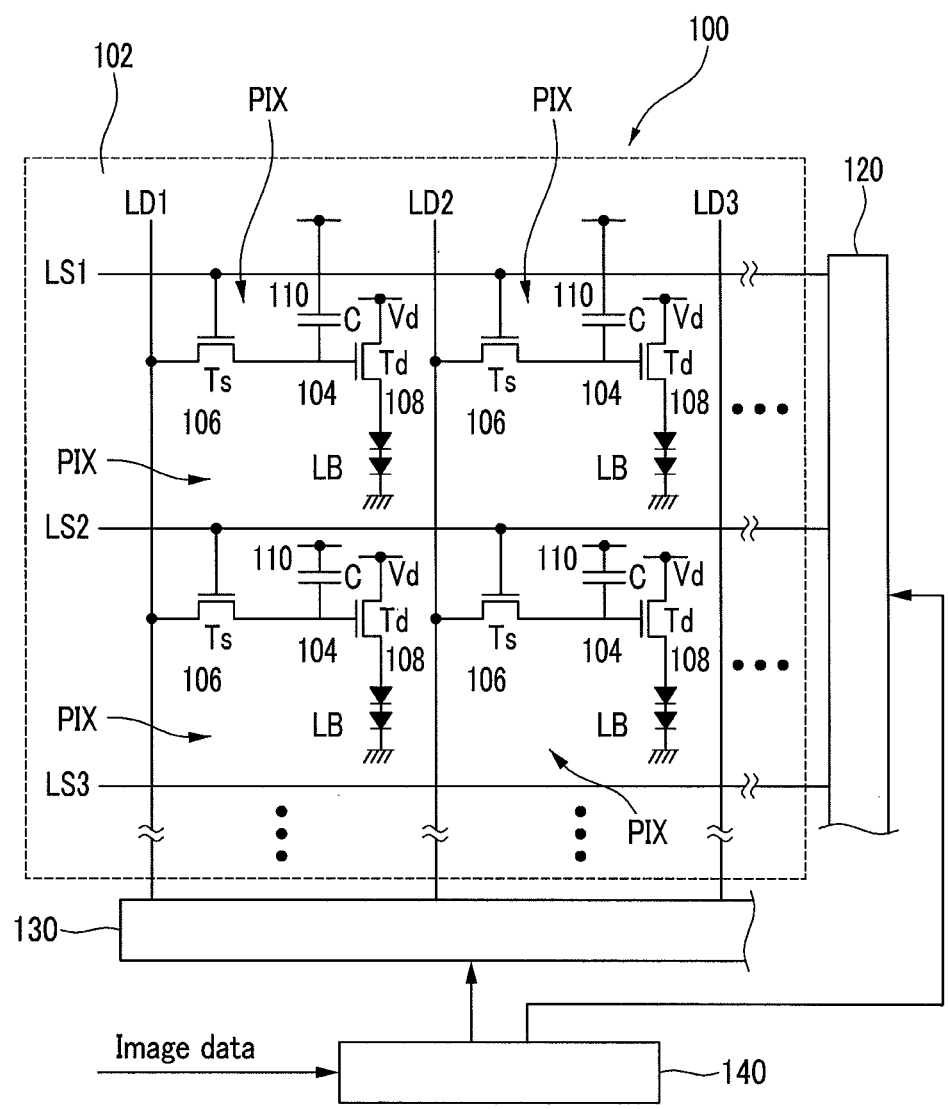
FIG. 3 is a view of an organic light emitting diode (OLED) display 100 according to the first exemplary embodiment.

Next, referring to FIG. 3, a schematic representation of the organic light emitting diode (OLED) display 100 of the exemplary embodiment will be described. As shown in FIG. 3, the organic light emitting diode (OLED) display 100 includes a plurality of pixels PIX, a scan line driving circuit 120, a data line driving circuit 130, scan lines LS1-LSm, data lines LD1-LDn, and a controller 140. Also, for better understanding and ease of description, FIG. 3 shows four pixels PIX, the scan lines LS1-LS3, and the data lines LD1-LD3. A plurality of pixels PIX respectively include an organic electro-luminescence light emitting element 104, a switching transistor $T_s$ 106, a driving transistor $T_d$ 108, and a capacitor C 110. The organic light emitting element 104 is connected to one terminal of a source electrode or a drain electrode of the driving transistor $T_d$ 108, and the other terminal is applied with a bias voltage $V_d$. The scan line LS is connected to a gate of the switching transistor $T_s$ 106, and the data line LD is connected to the source or the drain of the switching transistor $T_s$ 106. The image data is input to the controller 140 and is processed in the controller, and is transmitted to the data line driving circuit 130. The scan signal transmitted to the scan line driving circuit 120 from the controller 140 is applied to the scan lines LS1-LSm, and thereby each pixel PIX is driven. The data signal output from the data line driving circuit 130 is applied to the data lines LD1-LDn, and thereby the pixel PIX is driven. Also, the circuit constitution of the pixel PIX of FIG. 3 is only one example for realizing the present invention, and various constitutions for driving the organic light emitting element 104 may be applied.

Figure 4:
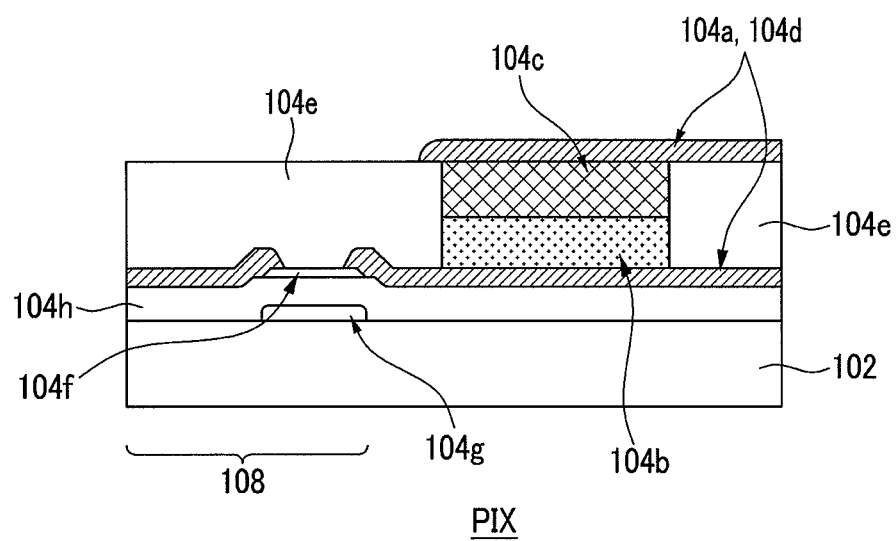
FIG. 4 is a view explaining a constitution of a pixel PIX of an organic light emitting diode (OLED) display 100 according to the first exemplary embodiment.

Referring to FIG. 4, an embodiment of a pixel PIX of an organic light emitting diode (OLED) display 100 according to the first exemplary embodiment will be described. The pixel PIX of FIG. 4 is only one example, and the pixel PIX may include various constitutions.

As shown in FIG. 4, the driving transistor $T_d$ 108 includes an insulating layer 104e, a semiconductor 104f, a gate electrode 104g, a gate insulating layer 104h, and a transparent electrode 104a (partially). In FIG. 3, the organic electro-luminescence emission layer 104b is deposited on the substrate 102, however as shown in FIG. 1, the active lighting layer 104c may be formed on the substrate 102.

Also, in FIG. 3, the organic light emitting diode (OLED) display 100 of the present invention is an active matrix type, however it is not limited thereto, and a passive type may be applied.

Also, in the present embodiment, the organic light emitting diode (OLED) display is a dual-side emitting type, however the present invention may be applied to a organic light emitting diode (OLED) display of a one-side emitting type.

According to the organic light emitting diode (OLED) display 100, when performing the black display, by decreasing the light transmittance of the active lighting layer 104c, the surrounding light incident to the organic light emitting element 104 is blocked or decreased by the active lighting layer 104c. Accordingly, the surrounding light incident to the organic light emitting element 104 is not transmitted through an opposite surface or is reduced, thereby performing the black display without the influence from the ambient light or with only a slight influence. Accordingly, by decreasing the light transmittance of the active lighting layer 104c, the light transmittance of the region to display the black may be locally controlled, thereby performing good black display.

Second Exemplary Embodiment

An organic light emitting diode (OLED) display according to the second exemplary embodiment will be described with reference to the accompanying drawings.

The organic light emitting diode (OLED) display according to the second exemplary embodiment is similar to the organic light emitting diode (OLED) display 100 of the first exemplary embodiment, however an electrode of the organic electro-luminescence emission layer and an electrode of the active lighting layer are separate, and the electrodes for the organic electro-luminescence emission layer and for the active lighting layer may be independently controlled. The description of the same components as of the first exemplary embodiment may be omitted and the description of the first exemplary embodiment may be applied.

The organic light emitting diode (OLED) display according to the second exemplary embodiment will be described with reference to the accompanying drawings.

The operation principle of the organic light emitting diode (OLED) display according to the second exemplary embodiment will be described with reference to FIG. 5. FIG. 5 shows the schematic constitution of an organic light emitting element 204 in the organic light emitting diode (OLED) display 200 according to the second exemplary embodiment. Also, for better understanding and ease of description, FIG. 5 partially shows the constitution of the organic light emitting diode (OLED) display 200 according to one exemplary embodiment.

As shown in FIG. 5, the organic light emitting diode (OLED) display 200 of the present embodiment includes the plurality of organic light emitting elements 204 and a substrate 202. The organic light emitting elements 204 respectively include an electrode 204a, an organic electro-luminescence emission layer 204b, an electrode 204c of the organic electro-luminescence layer, an insulating layer 204d, an electrode 204e for an active lighting layer, an active lighting layer 204f, and an electrode 204g for the active lighting layer. In the present embodiment, the electrode 204c for the organic electro-luminescence layer is common for a plurality of organic light emitting elements 204. Also, the element including the electrode 204a, the organic electro-luminescence emission layer 204b, and the electrode 204c for the organic electro-luminescence layer may be referred to as an organic electro-luminescence (light emitting) element, and an element including the electrode 204e for the active lighting layer, the active lighting layer 204f, and the electrode 204g of the active lighting layer may be referred to as an active lighting element.

The electrode 204a and the electrode 204c for the organic electro-luminescence of the organic electro-luminescence element 204 are applied with the voltage such that the light emitting is generated by the excitons generated by the recombination of the electrons and the holes injected among the organic electro-luminescence emission layer 204b. The active lighting layer 204f is a layer having a function of changing the light transmittance according to the voltage applied to the active lighting layers 204e and 204g. In the present embodiment, the active lighting layer 204f employs the normally black mode, that is, a mode for decreasing the light transmittance if the voltage is not applied to the active lighting layer 204c. In some embodiments, the active lighting layer 204f may employ the normally white mode, that is, the mode for decreasing the light transmittance when the voltage is applied to the active lighting layer 204f.

Also, in the present embodiment, the active lighting layer 204f that changes the light transmittance by applying the electric field is used. Accordingly, as an example of the active lighting layer 204f of the present embodiment, an electrowetting layer and a liquid crystal layer may be used.

Figure 5A:
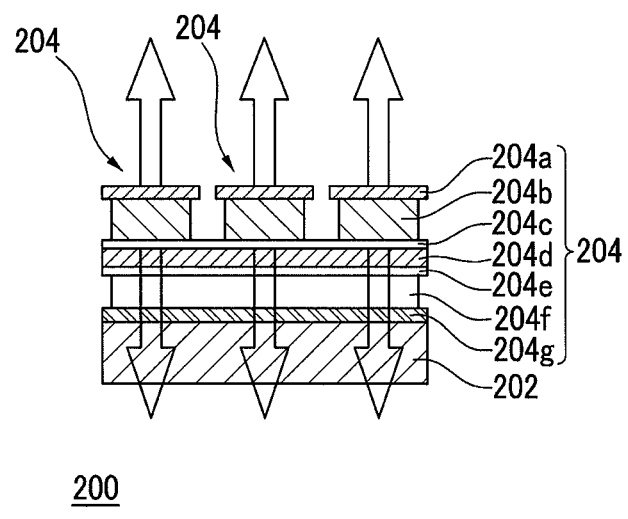
FIG. 5A and FIG. 5B are views showing a constitution of an organic light emitting element 204 in an organic light emitting diode (OLED) display 200 according to the second exemplary embodiment.

FIG. 5A shows the operation state of the case performing color display by light-emitting the organic electro-luminescence emission layer 204b. The voltage is applied to the electrode 204a for the organic electro-luminescence layer of the organic light emitting element 204 and the electrode 204c of the organic electro-luminescence layer such that the light emitting of the color is generated by the excitons generated by the recombination of the electrons and holes injected among the organic electro-luminescence emission layer 204b. At this time, in the present embodiment, the voltage is applied to the active lighting layer 204f by the application of the voltage to the electrodes 204e and 204g for the active lighting layer, and the transmittance of the active lighting layer 204f is increased. In this state, the surrounding light incident to the organic light emitting element 204 transmits through the electrode 204a, the organic electro-luminescence emission layer 204b, the electrode 204c for the organic electro-luminescence layer, the insulating layer 204d, the electrode 204e for the active lighting layer, the active lighting layer 204f, and the electrode 204g for the active lighting layer, and is transmitted through the opposite surface.

Figure 5B:
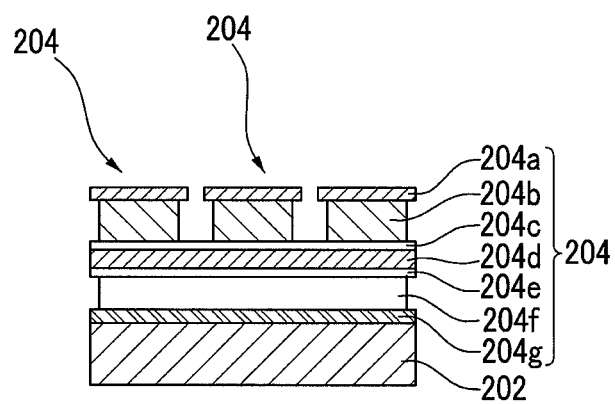

FIG. 5B shows the operation state of the case of displaying black, that is, the case in which the organic electro-luminescence emission layer 204b does not emit light. In the case of displaying black, the surrounding light incident to the organic light emitting element 204 is blocked or decreased by the active lighting layer 204f by decreasing the light transmittance of the active lighting layer 204f. In the present embodiment, the active lighting layer 204f is operated in the normally black mode, that is, when the voltage is not applied to the active lighting layer 204f, the light transmittance is decreased. Accordingly, the surrounding light incident to the organic electro-luminescence element 204 is not transmitted to the opposite surface or is decreased such that the black display may be performed in the state in which the influence from the surrounding light is eliminated or is decreased. As described above, the light transmittance of the region to display the black may be locally decreased by decreasing the light transmittance of the active lighting layer 204c, thereby performing good black display.

Figure 6:
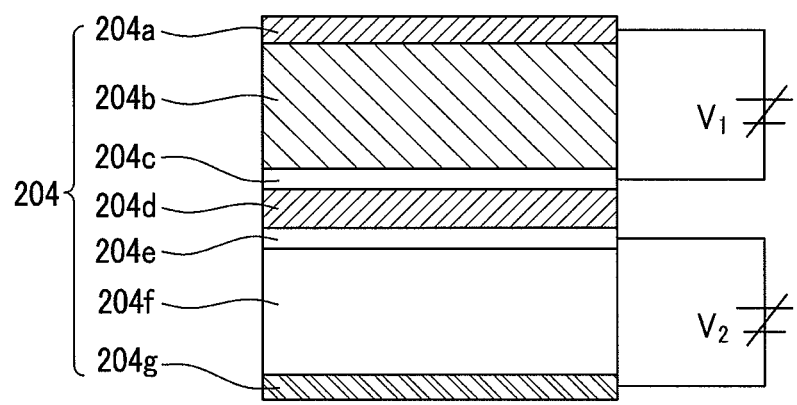
FIG. 6 is a view of an organic light emitting element 204 in an organic light emitting diode (OLED) display 200 according to the second exemplary embodiment.

FIG. 6 is a view of an organic light emitting element 204 in an organic light emitting diode (OLED) display 200 according to the second exemplary embodiment. In the present embodiment, the organic light emitting element 204 and the active lighting layer 204f are independently controlled. The voltage applied to the electrodes 204a and 204c for the organic electro-luminescence is referred to as $V_1$ (a luminance intensity control voltage), and the voltage applied to the electrodes 204e and 204g for the active lighting layer is referred to as $V_2$ (a light transmittance control voltage of the active lighting layer).

As described above, in the present embodiment, the operation of the organic electro-luminescence emission layer 204b and the active lighting layer 204f may be independently controlled.

Figure 7:
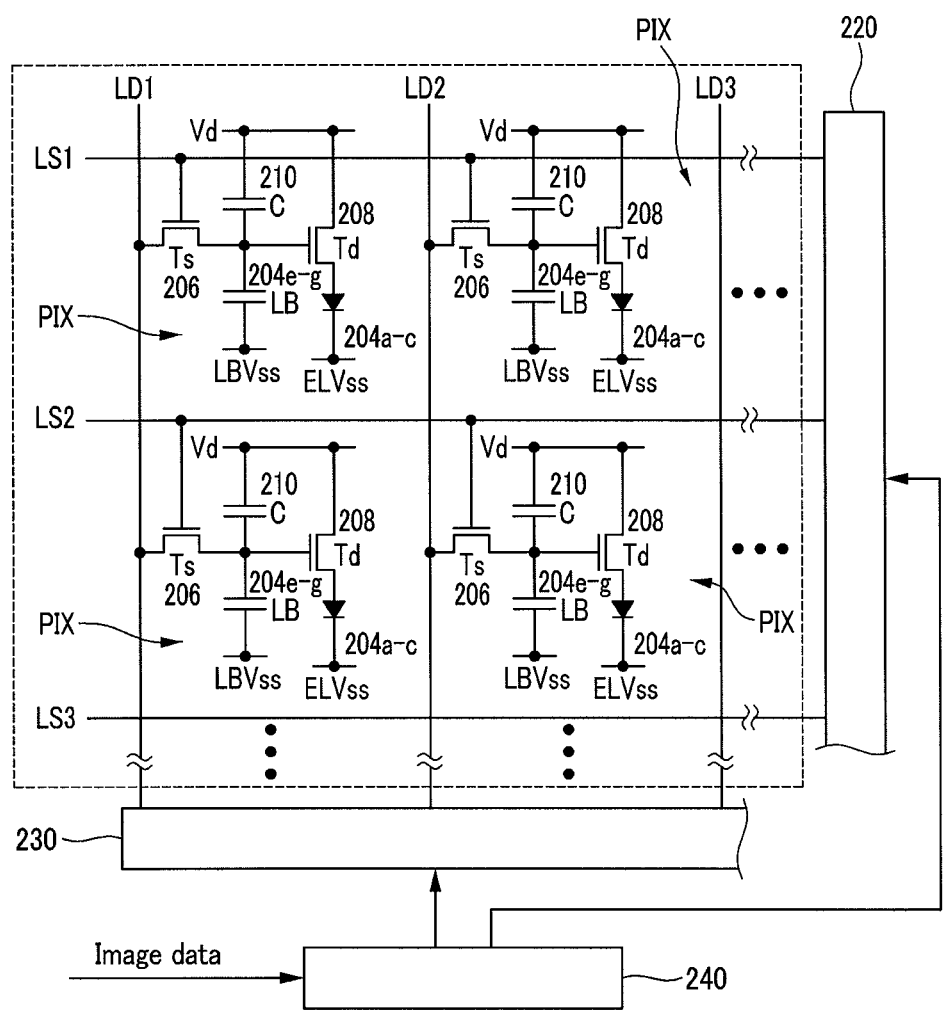
FIG. 7 is a view showing a schematic constitution of an organic light emitting diode (OLED) display 200 according to the second exemplary embodiment.

Next, a schematic constitution of an organic light emitting diode (OLED) display 200 according to the second exemplary embodiment will be described with reference to FIG. 7. As shown in FIG. 7, the organic light emitting diode (OLED) display 200 of the includes a plurality of pixels PIX, a scan line driving circuit 220, a data line driving circuit 230, scan lines LS1-LSm, data lines LD1-LDn, and a controller 240. Also, for better understanding and ease of description, FIG. 7 only shows four pixels PIX, the scan lines LS1-LS3, and the data lines LD1-LD3. A plurality of pixels PIX respectively include an organic light emitting element 204 including an organic electro-luminescence emission layer and an active lighting layer (may be referred to as organic electro-luminescence elements (204a-204c) and active lighting layers (204e-204g), a switching transistor $T_s$ 206, a driving transistor $T_d$ 208, and a capacitor C 210. One terminal of the source and the drain of the driving transistor $T_d$ 208 is connected to the organic light emitting element 204, and the other terminal is applied with a bias voltage $V_d$. The scan line LS is connected to the gate of the switching transistor $T_s$ 206, and the data line LD is connected to the drain or the source of the switching transistor $T_s$ 206. The image data is input to the controller 240 and is controlled in the controller 240, thereby being transmitted to the data line driving circuit 230. The scan signal transmitted to the scan line driving circuit 220 from the controller 240 is applied to the scan lines LS1-LSm, and thereby each pixel PIX is driven. The data signal output from the data line driving circuit 230 is applied to the data lines LD1-LDn, and thereby the pixel PIX is driven. Also, the circuit constitution of the pixel PIX shown in FIG. 7 is only one example of the exemplary embodiment according to the present invention, and various constitutions for operating the organic light emitting element 204 may be employed.

Figure 8:
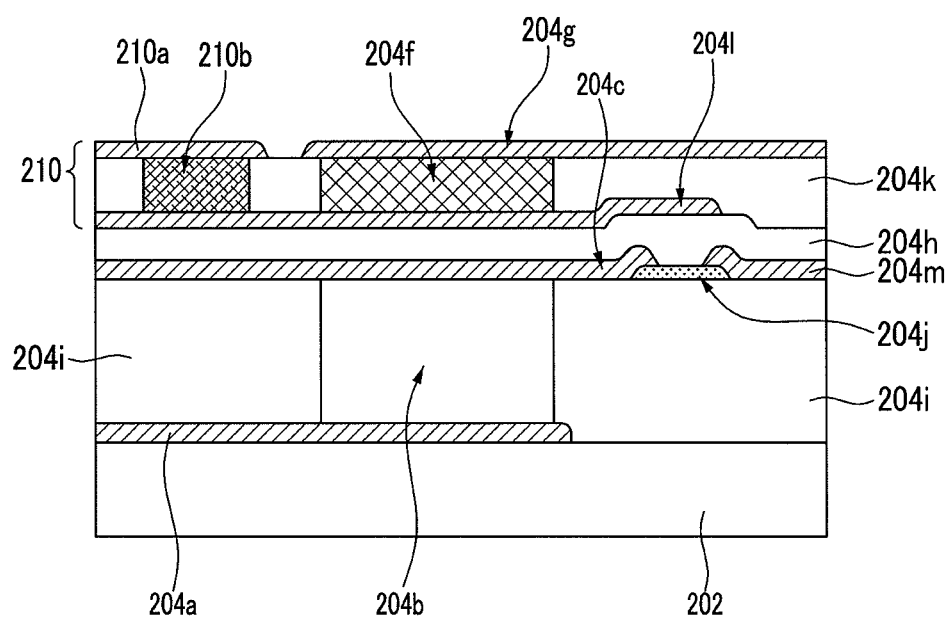
FIG. 8 is a view explaining a constitution of a pixel PIX of an organic light emitting diode (OLED) display 200 according to the second exemplary embodiment.

FIG. 8 is a view explaining a constitution of a pixel PIX of an organic light emitting diode (OLED) display 200 according to the second exemplary embodiment. Also, the constitution of the pixel PIX shown in FIG. 8 is only one example, and the pixel PIX may be employed with various constitutions.

As shown in FIG. 8, the driving transistor $T_d$ 208 includes insulating layers 204h, 204i, and 204k, a semiconductor 204j, a gate electrode (a portion extended from the transparent electrode 204l on the semiconductor 204j functions as a gate electrode), and transparent electrodes 204a, 204c, 204l, and 204m. The capacitor C 210 includes a dielectric material 210b, and electrodes 201a and 204l. Also, although not shown, the transparent electrode 204m and the electrode 210a are electrically connected through a penetration hole. In FIG. 8, the organic electro-luminescence emission layer 204B is deposited on the substrate 202, however as shown in FIG. 5, the active lighting layer 204f may be deposited on the substrate 202.

Also, in FIG. 8, the organic light emitting diode (OLED) display 200 is the active matrix type, however it is not limited thereto, and the passive type may be employed.

Also, in the present embodiment, the organic light emitting diode (OLED) display is a dual-side emitting type, however an organic light emitting diode (OLED) display of a one-side emitting type may be used.

According to the organic light emitting diode (OLED) display 200, when performing the black display, by decreasing the light transmittance of the active lighting layer 204f, the surrounding light incident to the organic light emitting element 204 is blocked or decreased by the active lighting layer 204f. Accordingly, the surrounding light incident to the organic light emitting element 104 is not emitted from the opposite surface or is reduced, thereby performing the black display without the influence from the surrounding light or with a slight influence. Accordingly, by decreasing the light transmittance of the active lighting layer 104c, the light transmittance of the region to display the black may be locally controlled, thereby performing good black display.

While this disclosure has been described in connection with what is presently considered to be practical exemplary embodiments, it is to be understood that the invention is not limited to the disclosed embodiments, but, on the contrary, is intended to cover various modifications and equivalent arrangements.

What is claimed is:

1. An organic light emitting diode (OLED) display comprising:
    an organic electro-luminescence emission layer; and
    a plurality of pixels respectively including an active lighting layer disposed on the organic electro-luminescence emission layer,
    wherein each of the active lighting layers is configured to selectively change its light transmittance.

2. An organic light emitting diode (OLED) display, comprising:
    an organic electro-luminescence emission layer; and
    a plurality of pixels respectively including an active lighting layer disposed on the organic electro-luminescence emission layer,
    wherein in a plurality of pixels, when the organic electro-luminescence emission layer emits light, light transmittance of the active lighting layer is decreased.

3. The organic light emitting diode (OLED) display of claim 1, further comprising:
    a first electrode, wherein the organic electro-luminescence emission layer is formed on the first electrode;
    a second electrode formed on the organic electro-luminescence emission layer, wherein the active lighting layer is formed on the second electrode; and
    a third electrode formed on the active lighting layer.

4. The organic light emitting diode (OLED) display of claim 1, further comprising:
    a first electrode, wherein the organic electro-luminescence emission layer is formed on the first electrode;
    a second electrode formed on the organic electro-luminescence emission layer;
    an insulating layer formed on the second electrode;
    a third electrode formed on the insulating layer, wherein the active lighting layer is formed on the third electrode; and
    a fourth electrode formed on the active lighting layer.

5. The organic light emitting diode (OLED) display of claim 4, wherein the first electrode, the second electrode, the third electrode, and the fourth electrode can be independently controlled.

6. The organic light emitting diode (OLED) display of claim 1, wherein the active lighting layer comprises at least one of an electrochromic layer having an electrochromic material, an electro-wetting layer having an electro-wetting material, a lighting mirror layer, and a liquid crystal layer having a liquid crystal material.

7. The organic light emitting diode (OLED) display of claim 1, wherein the active lighting layer is configured to block or reduce light incident to the organic electro-luminescence emission layer by decreasing the light transmittance of the active lighting layer.

8. An organic light emitting diode (OLED) display comprising:
- a plurality of pixels respectively including an active lighting layer and a plurality of organic electro-luminescence layers,
- wherein the plurality of organic electro-luminescence layers are formed on the active lighting layer,
- wherein the OLED display further comprises:
- a plurality of first electrodes, wherein each of the organic electro-luminescence emission layers are formed on the first electrodes;
- a second electrode formed on the organic electro-luminescence emission layers, wherein the second electrode is shared between the electro-luminescence emission layers;
- an insulating layer formed on the second electrode;
- a third electrode formed on the insulating layer, wherein the active lighting layer is formed on the third electrode; and
- a fourth electrode formed on the active lighting layer.

9. The organic light emitting diode (OLED) display of claim 8, wherein the active lighting layer is configured to block or reduce light incident to the organic electro-luminescence emission layers by decreasing the light transmittance of the active lighting layer.

10. The organic light emitting diode (OLED) display of claim 8, wherein the first electrode, the second electrode, the third electrode, and the fourth electrode are configured to be independently controlled.

11. The organic light emitting diode (OLED) display of claim 8, wherein the active lighting layer comprises at least one of an electrochromic layer having an electrochromic material, an electro-wetting layer having an electro-wetting material, a lighting mirror layer, and a liquid crystal layer having a liquid crystal material.

* * * * *